(12) United States Patent
Mao et al.

(10) Patent No.: US 10,044,960 B2
(45) Date of Patent: Aug. 7, 2018

(54) SYSTEMS AND METHODS FOR DETECTING LIGHT-EMITTING DIODE WITHOUT FLICKERING

(71) Applicant: OMNIVISION TECHNOLOGIES, INC., Santa Clara, CA (US)

(72) Inventors: Duli Mao, Sunnyvale, CA (US); Trygve Willassen, Oppegaard (NO); Johannes Solhusvik, Haslum (NO); Keiji Mabuchi, Los Altos, CA (US); Gang Chen, San Jose, CA (US); Sohei Manabe, San Jose, CA (US); Dyson H. Tai, San Jose, CA (US); Bill Phan, San Jose, CA (US); Oray Orkun Cellek, Mountain View, CA (US); Zhiqiang Lin, San Jose, CA (US); Siguang Ma, Mountain View, CA (US); Dajiang Yang, San Jose, CA (US); Boyd Albert Fowler, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/164,276

(22) Filed: May 25, 2016

(65) Prior Publication Data

US 2017/0347047 A1    Nov. 30, 2017

(51) Int. Cl.
*H04N 5/374* (2011.01)
*H04N 5/232* (2006.01)

(52) U.S. Cl.
CPC ......... *H04N 5/374* (2013.01); *H04N 5/23229* (2013.01)

(58) Field of Classification Search
CPC .. H04N 5/374; H04N 5/23229; H04N 5/3745; H04N 5/3559
See application file for complete search history.

(56) References Cited

U.S. PATENT DOCUMENTS

| 5,349,215 A | 9/1994 | Anagnostopoulos et al. |
| 8,237,831 B2 | 8/2012 | Adams, Jr. et al. |

(Continued)

OTHER PUBLICATIONS

Adachi et al., "A 200-μV/e⁻ CMOS Image Sensor with 100-ke⁻ Full Well Capacity," IEEE Journal of Solid-State Circuits, vol. 43, No. 4, pp. 823-830 (2008).

(Continued)

*Primary Examiner* — Jason A Flohre
(74) *Attorney, Agent, or Firm* — Christensen O'Connor Johnson Kindness PLLC

(57) ABSTRACT

An image sensor for detecting light-emitting diode (LED) without flickering includes a pixel array with pixels. Each pixel including subpixels including a first and a second subpixel, dual floating diffusion (DFD) transistor, and a capacitor coupled to the DFD transistor. First subpixel includes a first photosensitive element to acquire a first image charge, and a first transfer gate transistor to selectively transfer the first image charge from the first photosensitive element to a first floating diffusion (FD) node. Second subpixel includes a second photosensitive element to acquire a second image charge, and a second transfer gate transistor to selectively transfer the second image charge from the second photosensitive element to a second FD node. DFD transistor coupled to the first and the second FD nodes. Other embodiments are also described.

17 Claims, 15 Drawing Sheets

(56) References Cited

U.S. PATENT DOCUMENTS

| | | | |
|---|---|---|---|
| 8,773,562 B1* | 7/2014 | Fan | H01L 27/14643 250/208.1 |
| 2007/0001208 A1 | 1/2007 | Graham et al. | |
| 2007/0013798 A1* | 1/2007 | Ahn | H04N 5/335 348/308 |
| 2009/0273696 A1 | 11/2009 | Krymski | |
| 2010/0118167 A1 | 5/2010 | Johnson | |
| 2011/0096215 A1* | 4/2011 | Choi | H01L 27/14632 348/294 |
| 2011/0116078 A1* | 5/2011 | Cho | H01L 27/14625 356/51 |
| 2013/0256510 A1 | 10/2013 | Lyu | |
| 2013/0277534 A1* | 10/2013 | Watanabe | H01L 27/14806 250/208.1 |
| 2014/0063300 A1 | 3/2014 | Lin et al. | |
| 2014/0239152 A1 | 8/2014 | Chen et al. | |
| 2014/0320718 A1* | 10/2014 | Fan | H01L 27/14643 348/308 |
| 2016/0086984 A1* | 3/2016 | Wang | H01L 27/1463 257/292 |
| 2016/0181314 A1* | 6/2016 | Wan | H04N 5/37457 348/302 |
| 2017/0099446 A1* | 4/2017 | Cremers | H04N 5/37452 |

OTHER PUBLICATIONS

ROC (Taiwan) Pat. App. No. 106117088—Search Report with English Translation dated May 7, 2018, 2 pages.

\* cited by examiner

SYSTEMS AND METHODS FOR DETECTING LIGHT-EMITTING DIODE WITHOUT FLICKERING

FIELD

An example of the present invention relates generally to image sensors. More specifically, examples of the present invention are related to image sensors that detect a high illumination element (e.g., light emitting diode (LED)) without flickering and methods of implementing thereof.

BACKGROUND

High-speed image sensors have been widely used in many applications in different fields including the automotive field, the machine vision field, and the field of professional video photography. Some applications in these fields require the detection and capture of LED lights, which has proven to be difficult. For example, automotive image sensors face the problem of LED flickering. Future automotive vehicle lights, traffic lights and signs will include LED that is pulsed at 90-300 Hz with high peak light intensity. This requires that the minimum exposure time be kept over 10 ms. A very high full well capacity (FWC) or very low light intensity are thus needed to avoid pixels to get saturated and lose useful information.

Current solutions to address the overflow and loss of useful information from saturated pixels include enhancing the FWC with a lateral overflow integrating capacitor (LOFIC). When the photodiode is filled after reaching a corresponding FWC, the excess charge is leaked into a floating drain. A large capacitor connected to the floating drain can then store the excess charge. However, the maximum FWC is thus limited by the floating drain capacitor rather than the photodiode FWC. Other solutions involve using non-linear sensor (e.g., logarithmic sensors) to enlarge the FWC, or using split diode pixels or sub-pixel sensors to maintain minimum exposure time by minimizing sensitivity of small photodiode. Further, for high dynamic range (HDR) applications, the existing image sensors struggle due to the limited charge storage and limited FWC.

BRIEF DESCRIPTION OF THE DRAWINGS

The embodiments of the invention are illustrated by way of example and not by way of limitation in the figures of the accompanying drawings in which like references indicate similar elements throughout the various views unless otherwise specified. It should be noted that references to "an" or "one" embodiment of the invention in this disclosure are not necessarily to the same embodiment, and they mean at least one. In the drawings.

Figure 1:
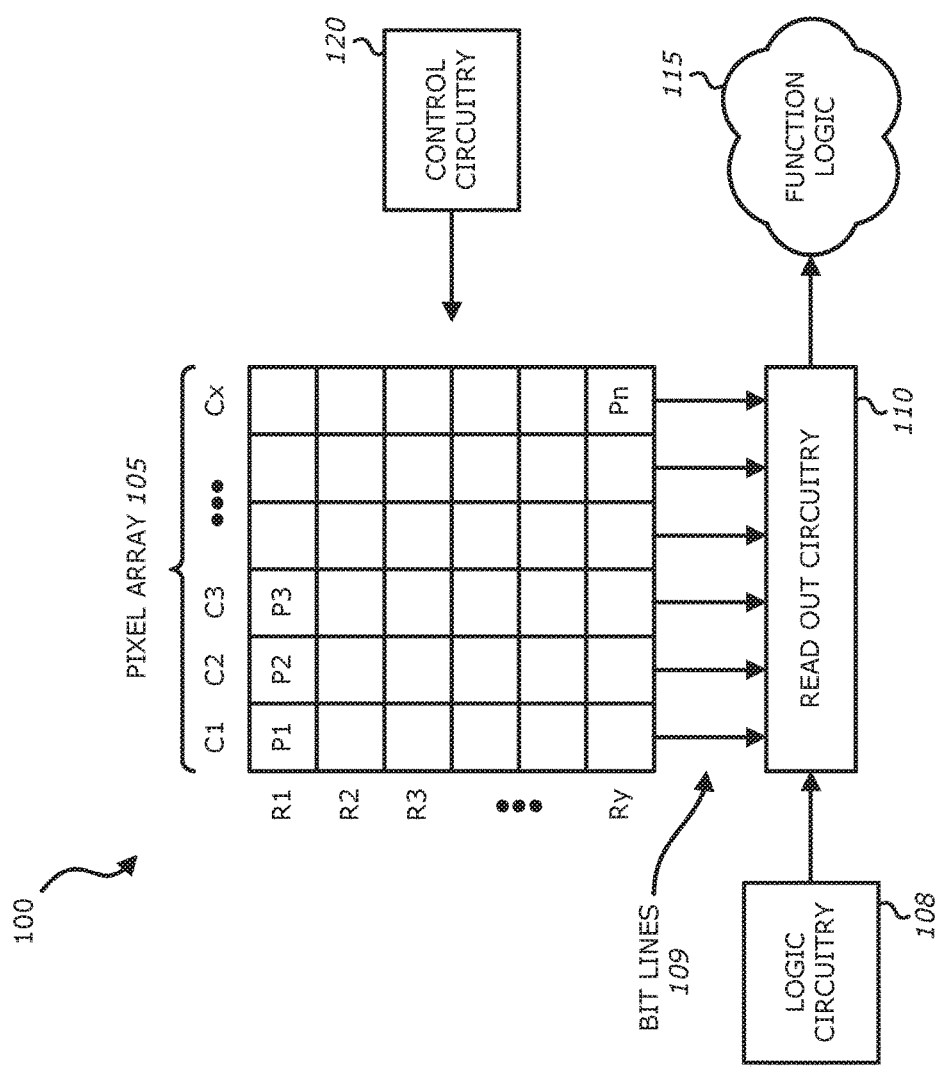
FIG. 1 is a block diagram illustrating an example imaging system that detects a LED without flickering in accordance to one embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. However, it is understood that embodiments of the invention may be practiced without these specific details. In other instances, well-known circuits, structures, and techniques have not been shown to avoid obscuring the understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Particular features, structures or characteristics may be included in an integrated circuit, an electronic circuit, a combinatorial logic circuit, or other suitable components that provide the described functionality.

FIG. 1 is a block diagram illustrating an example imaging system 100 that detects a LED without flickering in accordance to one embodiment of the invention. Imaging system 100 may be a complementary metal-oxide-semiconductor ("CMOS") image sensor. As shown in the depicted example in FIG. 1, imaging system 100 includes pixel array 105 coupled to control circuitry 120 and readout circuitry 110, which is coupled to function logic 115 and logic control 108.

The illustrated embodiment of pixel array 105 is a two-dimensional ("2D") array of imaging sensors or pixel cells (e.g., pixel cells P1, P2, . . . , Pn). In one example, each pixel cell is a CMOS imaging pixel. As illustrated, each pixel cell is arranged into a row (e.g., rows R1 to Ry) and a column (e.g., columns C1 to Cx) to acquire image data of a person, place or object, etc., which can then be used to render an image of the person, place or object, etc. Several color imaging pixels may be included in the active area of an image sensor (e.g., pixel array 105), such as red (R), green (G), and blue (B) imaging pixels. For example, the pixel array 105 may include four color imaging pixels (e.g., one red (R), one green (G), and one blue (B)) arranged into a Bayer pattern. Other color imaging pixels and other color patterns may be implemented into the pixel array 105 in accordance with the teachings of the present disclosure. For example, each pixel cell (e.g., pixel cells P1, P2, . . . , Pn) may include a plurality of subpixels respectively including a plurality of photosensitive elements (e.g., photodiodes) and a plurality of transfer gate transistors. Each of the subpixels in a pixel cell may include the same color imaging pixel (see FIG. 2) or one of the subpixels in a pixel cell may include a color imaging pixel and the remaining subpixels in the pixel cell may include clear color imaging pixels (see FIG. 3).

Figure 6:
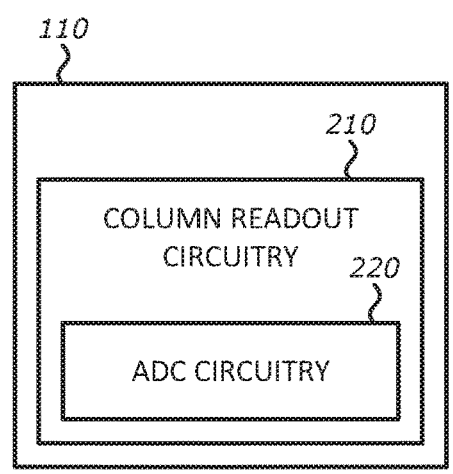
FIG. 6 is a block diagram illustrating the details of the readout circuitry in FIG. 1 in accordance to one embodiment of the invention.

In one example, after each pixel has acquired its image data or image charge, the image data is read out by readout circuitry 110 through readout column bit lines 109 and then transferred to function logic 115. In one embodiment, a logic circuitry 108 can control readout circuitry 110 and output image data to function logic 115. In various examples, readout circuitry 110 may include amplification circuitry (not illustrated), a column readout circuitry 210 that includes analog-to-digital conversion (ADC) circuitry 220 (as illustrated in FIG. 6), or otherwise. Function logic 115 may simply store the image data or even manipulate the image data by applying post image effects (e.g., crop, rotate, remove red eye, adjust brightness, adjust contrast, or otherwise). In one embodiment, function logic 115 in imaging system 100 may periodically perform LED detection or detection of other high illumination devices or elements. In one example, readout circuitry 110 may read out a row of image data at a time along readout column lines (illustrated) or may read out the image data using a variety of other techniques (not illustrated), such as a serial read out or a full parallel read out of all pixels simultaneously.

In one example, control circuitry 120 is coupled to pixel array 105 to control operational characteristics of pixel array 105. For example, control circuitry 120 may generate a shutter signal for controlling image acquisition. In one example, the shutter signal is a global shutter signal for simultaneously enabling all pixels within pixel array 105 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In another example, control circuitry 120 may comprise the horizontal and vertical scanning circuitry, which selects the row and/or column of pixels to be read out. Scanning circuitry may include, selection circuitry (e.g., multiplexers), etc. to readout a row or column of image data at a time along readout column bit lines 109 or may readout the image data using a variety of other techniques, such as a serial readout or a full parallel readout of all pixels simultaneously. When scanning circuitry selects pixels in pixel array 105, the pixels convert light incident to the pixels to a signal and output the signal to column readout circuitry 210. Column readout circuitry 210 may receive the signal from scanning circuitry or from pixel array 105.

Referring to FIG. 6, a block diagram of the details of the readout circuitry 110 in FIG. 1 in accordance to one embodiment of the invention is illustrated. The readout circuitry 110 includes the column readout circuitry 210 that includes ADC circuitry 220. While not illustrated, in some embodiments, a plurality of column readout circuitry 210 may be included in readout circuitry 110. It is also understood that column readout circuitry 210 may be similar for each column of pixel array 105. ADC circuitry 220 may be as a double ramp ADC or other types of column ADC (i.e., SAR, cyclic, etc.). ADC circuitry 220 may convert each of the image data signal from pixel array 105 from analog to digital.

Figure 2:
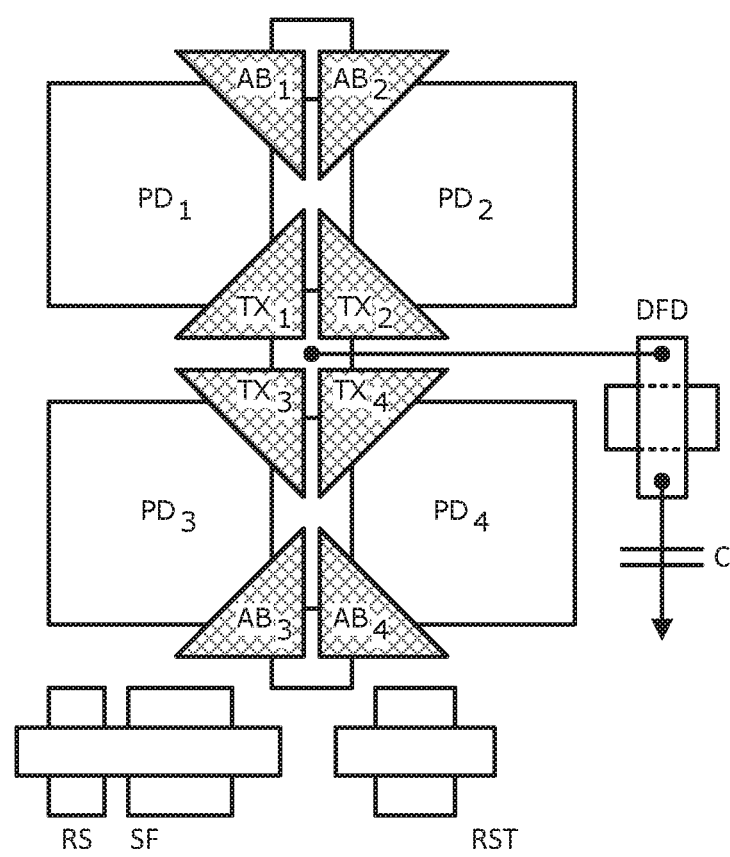
FIG. 2 is a block diagram of a pixel in the pixel array in the imaging system in FIG. 1 that detects a LED without flickering in accordance to one embodiment of the invention.

FIG. 2 is a block diagram of a pixel in the pixel array 105 in the imaging system in FIG. 1 that detects a LED without flickering in accordance to one embodiment of the invention. While embodiments herein are described to detect a LED, it is understood that the embodiments may also be implemented to detect other high illumination elements or devices. To address the issues of overflow and loss of useful information from saturated pixels, a subpixel sensor combined with LOFIC and selective anti-blooming is used in FIG. 2. As shown in FIG. 2, each of the pixels in the pixel array 105 includes a plurality of subpixels. The subpixels respectively include photosensitive elements $PD_1$-$PD_n$ (n>1), transfer gate transistors $TX_1$-$TX_n$, and anti-blooming (AB) gates $AB_1$-$AB_n$. In this embodiment, each pixel includes four subpixels (e.g., n=4). Each photosensitive element $PD_1$-$PD_n$ acquires an image charge. Each transfer gate transistor $TX_1$-$TX_n$ selectively transfers the respective image charge from the photosensitive element $PD_1$-$PD_n$ to a respective floating diffusion (FD) node. Each anti-blooming (AB) gate $AB_1$-$AB_n$ is coupled to a respective photosensitive element $PD_1$-$PD_n$. For example, the first subpixel includes a first photosensitive element $PD_1$ to acquire a first image charge, a first transfer gate transistor $TX_1$ to selectively transfer the first image charge from the first photosensitive element $PD_1$ to a first FD node, and a first AB gate $AB_1$ coupled to the first photosensitive element $PD_1$; and the second subpixel including a second photosensitive element $PD_2$ to acquire a second image charge, a second transfer gate transistor $TX_2$ to selectively transfer the second image charge from the second photosensitive element $PD_2$ to a second FD node, and a second AB gate $AB_2$ coupled to the second photosensitive element $PD_2$. As shown in FIG. 2, each pixel also includes a dual floating diffusion (DFD)

transistor coupled to the FD nodes and a capacitor C coupled to the DFD transistor. Capacitor C may be a lateral overflow integrating capacitor (LOFIC). In one embodiment, the DFD transistor is also coupled to the AB gates $AB_1$-$AB_n$.

Within a pixel transistor region, each pixel in FIG. 2 includes a source-follower transistor SF, a row select transistor RS, and a reset transistor RST. Each of the transistors (e.g., source-follower transistor SF, a row select transistor RS, and a reset transistor RST) includes a gate and doped regions (i.e., drain and source).

Figure 14:
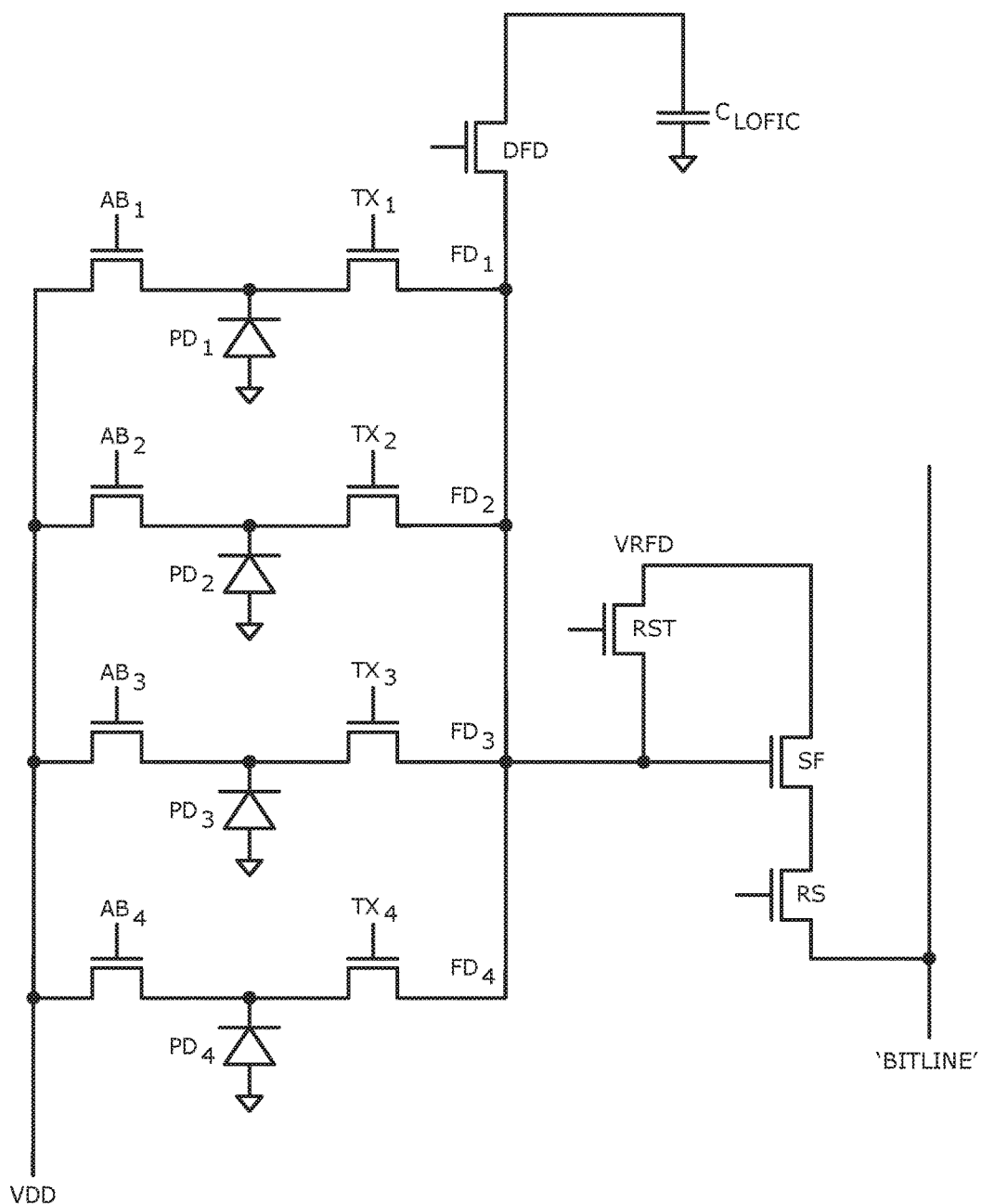
FIG. 14 is a block diagram of a pixel in the pixel array in the imaging system in FIGS. 2-3 that detects a LED without flickering in accordance to one embodiment of the invention.

Referring to FIG. 14, a block diagram of a pixel in the pixel array in the imaging system in FIG. 2 that detects a LED without flickering is further illustrated in accordance to one embodiment of the invention. As shown in FIG. 14, the $FD_1$-$FD_4$ are coupled to the $AB_1$-$AB_4$ via the transfer gate transistors $TX_1$-$TX_4$. During a readout operation of the first photodiode $PD_1$, transfer gate $TX_1$ receives a transfer signal, which causes the transfer of charge accumulated in photodiode $PD_1$ to the first FD node. In one embodiment, the FD nodes (e.g., first to fourth FD nodes) coupled respectively to the transfer gate transistors $TX_1$-$TX_4$ are included in shared floating diffusion region FD. In one embodiment, AB gates $AB_1$-$A_B$ are also coupled to the shared floating diffusion region FD via the transfer gate transistors $TX_1$-$TX_4$.

The reset transistor RST is coupled to reset (e.g., discharge or charge the FD to a preset voltage) under control of a reset signal received at the reset transistor RST's gate. The FD nodes are coupled to gate of the source-follower transistor SF. The source-follower transistor SF operates as a source-follower providing a high impedance output from the associated FD nodes. Finally, the row select transistor RS selectively couples the output of pixel circuitry in the pixel to the column bitline connection under control of a row select signal received.

Also included in the pixel transistor region are a shared source follower voltage supply connection, a column bitline connection, and a shared reset voltage supply connection. In one embodiment, connections are metal pads for connecting with metal routings that carry their respective signals among several pixels.

In one embodiment, the first AB gate $AB_1$ is biased to leak less than the first transfer gate transistor $TX_1$ and the remaining AB gates $AB_2$-$AB_4$ are biased to leak more than the corresponding transfer gate transistors $TX_2$-$TX_4$. Accordingly, during signal integration, all transfer gate transistors $TX_1$-$TX_4$ are turned off, and the first subpixel with the less leaky AB gate $AB_1$ will bloom into the floating drain (e.g., DFD transistor) after the first photosensitive element $PD_1$ is full or saturated. In other words, DFD transistor selectively couples to first AB gate $AB_1$ via the first transfer gate transistor $TX_1$ and capacitor C stores a bloomed charge from the first photosensitive element. Capacitor C may be implemented as a MOS capacitor, a metal-insulator-metal (MIM) capacitor or combinations of types of capacitor. Remaining subpixels including AB gates $AB_2$-$AB_4$ that are more leaky than the corresponding transfer gate transistors $TX_2$-$TX_4$ will bloom to a power rail VDD through the AB gates $AB_2$-$AB_4$. The dynamic range is thus increased by a factor that is equal to the number of subpixels in the pixel.

At the end of integration, the bloomed charge stored on capacitor C is read out using three transistors (3T) timing, and the first, second, third, and fourth image charges from photosensitive elements $PD_1$-$PD_4$ are subsequently readout as photosensitive element signals, respectively, using four transistors (4T) timing. The multiple transfer gate transistors $TX_1$-$TX_n$ of the subpixels may be turned on together to achieve FD charge binning or may be transferred separately to achieve high dynamic range (HDR) using differential integration of the subpixels.

Figure 3:
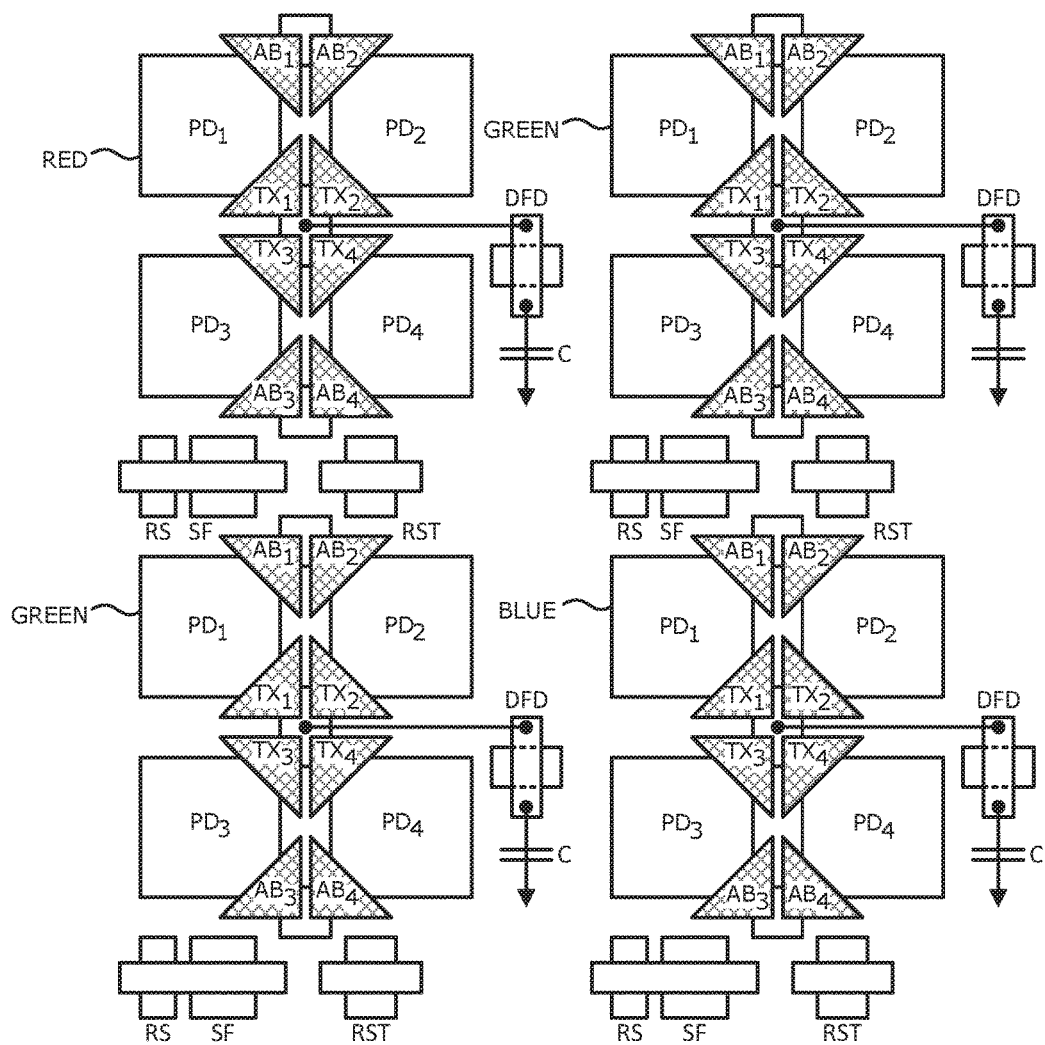
FIG. 3 is a block diagram of a pixel in the pixel array in the imaging system in FIG. 1 that detects a LED without flickering in accordance to one embodiment of the invention.

FIG. 3 is a block diagram of a pixel in the pixel array in the imaging system in FIG. 1 that detects a LED without flickering in accordance to one embodiment of the invention. To address the issues of overflow and loss of useful information from saturated pixels, a subpixel sensor combined with LOFIC and selective anti-blooming is further combined with the RGBC pattern is used in FIG. 3. Accordingly, the embodiment discussed in FIG. 2 may further be combined with subpixel red (R), green (G), blue (B), and clear (C) color patterns in FIG. 3. As shown in FIG. 3, one of the subpixels in the pixel retains the normal Bayer color pattern, while the other remaining subpixels (e.g., remaining three subpixels) are replaced with clear color filter to increase the low-light sensitivity. In FIG. 3, first photosensitive element $PD_1$ in each pixel includes the Bayer color pattern while the second, third, and fourth photosensitive elements $PD_2$-$PD_4$ include a clear color filter.

Similar to the embodiment in FIG. 2, in FIG. 3, the first AB gate $AB_1$ is biased to leak less than the first transfer gate transistor $TX_1$ and the remaining AB gates $AB_2$-$AB_4$ are biased to leak more than the corresponding transfer gate transistors $TX_2$-$TX_4$. Referring to FIG. 14, a block diagram of the details of a pixel in the pixel array in the imaging system in FIGS. 2 and 3 that detects a LED without flickering in accordance to one embodiment of the invention is illustrated. Accordingly, the subpixel with the RGB color filter is the one with an AB gate $AB_1$ that is less leaky than the corresponding transfer gate transistor $TX_1$. During signal integration, all transfer gate transistors $TX_1$-$TX_4$ are turned off, and the first subpixel with the less leaky AB gate $AB_1$ will bloom into the floating drain (e.g., DFD transistor) after the first photosensitive element $PD_1$ is full or saturated. In other words, DFD transistor selectively couples to first AB gate $AB_1$ via the first transfer gate transistor $TX_1$ and capacitor C stores a bloomed charge from the first photosensitive element. Thus, any excess charge in the RGB subpixels will bloom into the floating drain and be stored on LOFIC. Capacitor C in FIG. 3 may also be implemented as a MOS capacitor, a MIM capacitor or combinations of types of capacitor. Remaining subpixels including AB gates $AB_2$-$AB_4$ that are more leaky than the corresponding transfer gate transistors $TX_2$-$TX_4$ will bloom to a power rail VDD through the AB gates $AB_2$-$AB_4$. The dynamic range is thus increased by a factor that is equal to the number of subpixels in the pixel.

Similar to the embodiment in FIG. 2, in FIG. 3, at the end of integration, the bloomed charge stored on capacitor C is read out using 3T timing, and the first, second, third, and fourth image charges from photosensitive elements $PD_1$-$PD_4$ are subsequently readout as photosensitive element signals, respectively, using 4T timing. The RBG subpixels will thus be read out separately from the clear subpixels. The multiple transfer gate transistors $TX_2$-$TX_4$ of the clear subpixels may be turned on together to achieve FD charge binning or may be transferred separately to achieve HDR using differential integration of the subpixels. The RGB subpixel signal and the clear subpixel signal may be combined in image signal processing (ISP) to produce a final image charge.

Figure 4:
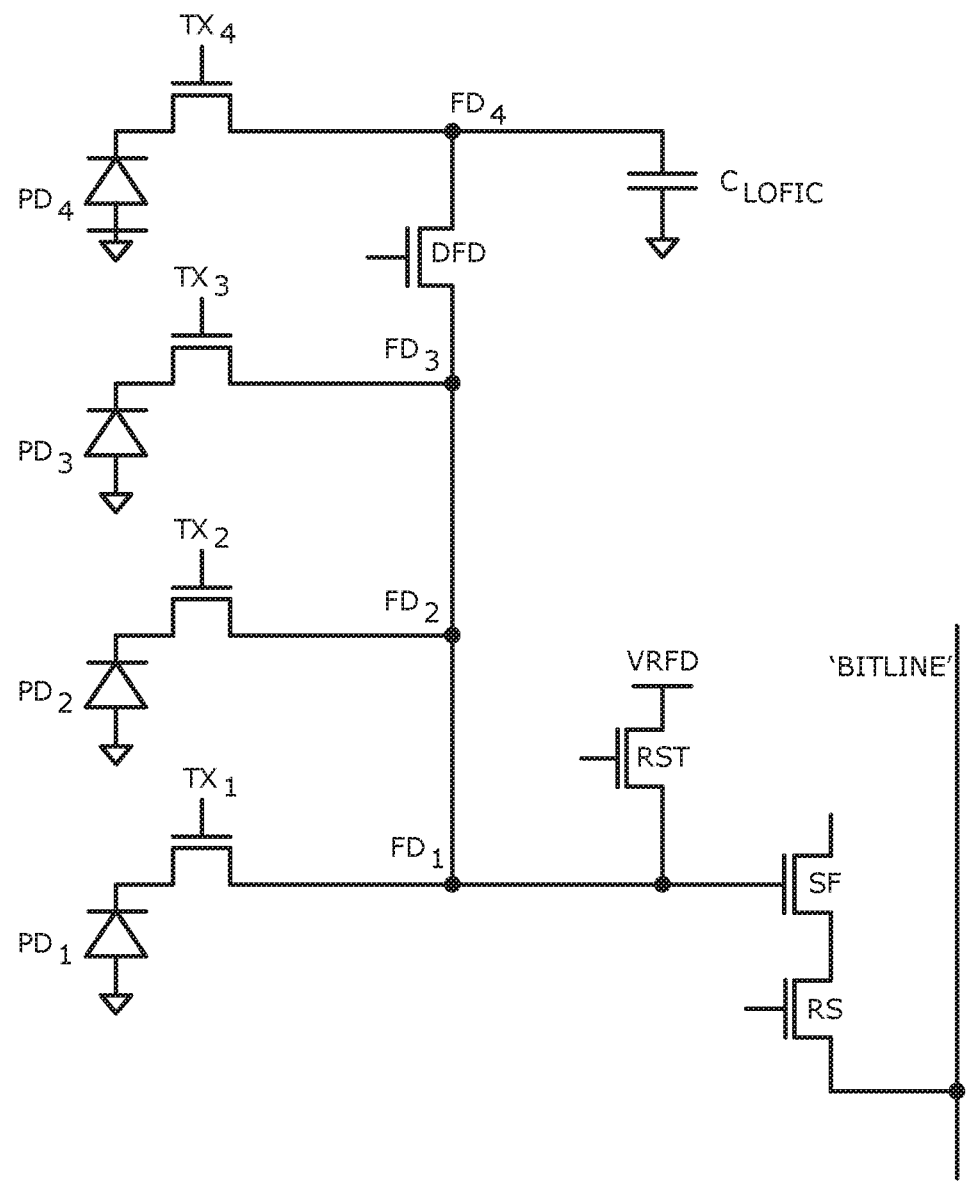
FIG. 4 is a block diagram of a pixel in the pixel array in the imaging system in FIG. 1 that detects a LED without flickering in accordance to one embodiment of the invention.

FIG. 4 is a block diagram of a pixel in the pixel array in the imaging system in FIG. 1 that detects a LED without flickering in accordance to one embodiment of the invention. In this embodiment, a subpixel sensor combined with LOFIC and selective anti-blooming is used to address the issues of overflow and loss of useful information from saturated pixels without dedicated AB devices. In FIG. 4, pixel circuitry of each pixel includes four photosensitive elements ($PD_1$-$PD_4$), four transfer transistors ($TX_1$-$TX_4$), a capacitor C (or $C_{LOFIC}$), a DFD transistor, a reset transistor RST, a source-follower transistor SF, and a row select transistor RS. During a readout operation of the first photodiode $PD_1$, transfer transistor $TX_1$ receives a transfer signal, which causes transfer transistor $TX_1$ to transfer the charge accumulated in photodiode $PD_1$ to a FD node $FD_1$. In this embodiment, each of the subpixels includes one photosensitive element $PD_1$-$PD_4$ and one transfer transistor $TX_1$-$TX_4$.

Reset transistor RST is coupled between a reset voltage supply VRFD (or power rail VDD) and the FD node $FD_1$ to reset (e.g., discharge or charge the FD node $FD_1$ to a preset voltage) under control of a reset signal. As shown in FIG. 4, the FD nodes $FD_1$, $FD_2$, and $FD_3$ may be the same node. The FD node $FD_1$ is coupled to the gate of the source-follower transistor SF. The source-follower transistor SF is coupled between a source-follower voltage supply SFVDD (or power rail VDD) and row select transistor RS. The source-follower transistor SF operates as a source-follower providing a high impedance output from FD node $FD_1$. Finally, row select transistor RS selectively couples the output of the pixel circuitry to the column bitline under control of a row select signal. In one embodiment, the transfer signals, the reset signal, and the row select signal are generated by control circuitry 120. The transfer signals, the reset signal, the row select signal, the source-follower voltage supply SFVDD, the reset voltage supply VRFD, and ground may be routed in the pixel circuitry by way of metal interconnect layers (i.e., routings) included in the image sensor.

In FIG. 4, the top photosensitive element $PD_4$ is for LED detection. Photosensitive element $PD_4$ acquires a fourth image charge and the transfer transistor $TX_4$ selectively transfers the fourth image charge from the fourth photosensitive element $PD_4$ to a fourth FD node. DFD transistor and capacitor C is coupled to the fourth FD node $FD_4$. Accordingly, during signal integration, capacitor C stores excess image charge from the fourth photosensitive element $PD_4$ that is leaking through the fourth transfer gate transistor $TX_4$. When capacitor C saturates due to extreme light, the anti-blooming path for the fourth photosensitive element $PD_4$ and the saturated capacitor C is through the DFD transistor and the reset transistor RST. The remaining photodiodes $PD_1$-$PD_3$ have anti-blooming path through remaining transfer gate transistors $TX_1$-$TX_3$ and reset transistor RST.

At the end of signal integration, the image charge stored on the fourth photosensitive element $PD_4$ and the excess first image charge stored on the capacitor C may be read out using pseudo correlated double sampling (pseudo-CDS) 3T timing, and image charges on the photosensitive elements $PD_1$-$PD_3$ that are binned together may be read out using Correlated Double Sampling (CDS). In one embodiment, the image charges may be readout three times: first, the fourth image charge on the fourth photosensitive element $PD_4$ and the excess image charge stored on capacitor C are readout; second, the image charges from photosensitive elements $PD_1$-$PD_3$ that are binned together are then readout (e.g., High CG); and third, image charges from photosensitive elements $PD_1$-$PD_3$ that are binned together and the excess image charge stored on capacitor C are then read out (e.g., Low CG).

In some embodiments, the fourth transfer gate transistor $TX_4$ is omitted to make it possible to reduce the size and sensitivity of photosensitive element $PD_4$ and thus, enhancing dynamic range.

Figure 8:
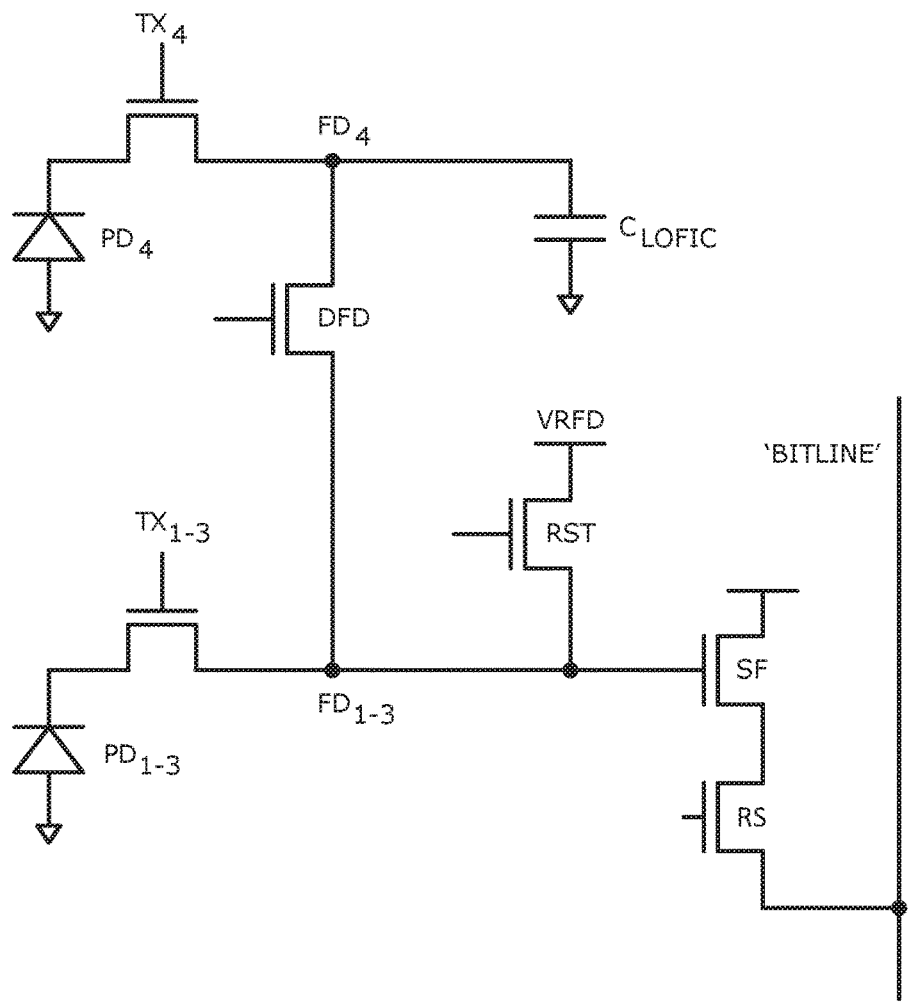
FIG. 8 is a block diagram of a pixel in the pixel array in the imaging system in FIG. 1 that detects a LED without flickering in accordance to one embodiment of the invention.

As shown in FIG. 8, which illustrates a block diagram of a pixel in the pixel array in the imaging system in FIG. 1 that detects a LED without flickering in accordance to one embodiment of the invention, the pixel layout as described in FIG. 4 does not need to be 2×2 symmetric. Instead, in the embodiment in FIG. 8, the pixel layout may be generalized to split-diode pixels such as one-large photosensitive element $PD_{1-3}$ that replaces the photosensitive elements $PD_1$-$PD_3$ in FIG. 4 and one small photosensitive element $PD_4$, where the small photosensitive element $PD_4$ is coupled to the capacitor C.

Figure 5:
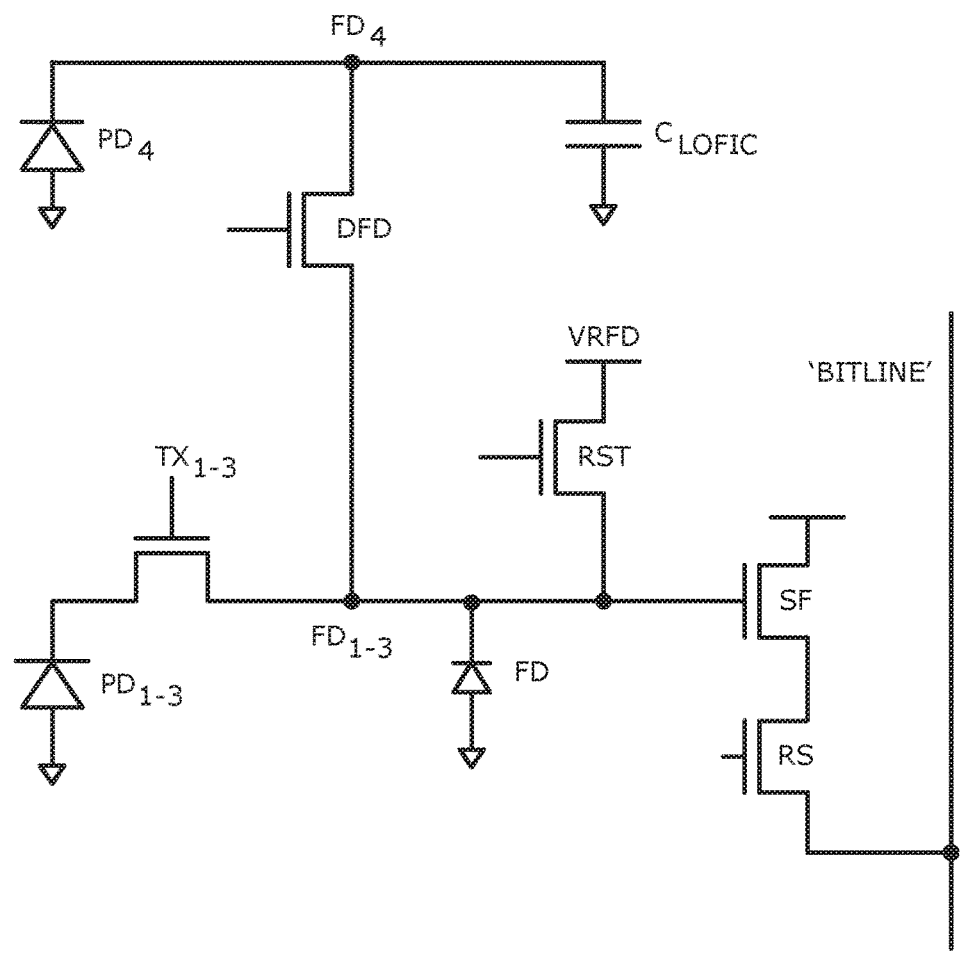
FIG. 5 is a block diagram of a pixel in the pixel array in the imaging system in FIG. 1 that detects a LED without flickering in accordance to one embodiment of the invention.

FIG. 5 is a block diagram of a pixel in the pixel array in the imaging system in FIG. 1 that detects a LED without flickering in accordance to one embodiment of the invention. In this embodiment, a subpixel sensor combined with LOFIC and selective anti-blooming is used to address the issues of overflow and loss of useful information from saturated pixels without dedicated AB devices. In contrast to the embodiment in FIG. 4, the fourth transfer gate transistor $TX_4$ is omitted and a FD photosensitive element is coupled to a floating node $FD_{1-3}$. Similar to the embodiment in FIG. 8, the pixel circuitry includes one large photosensitive element $PD_{1-3}$ and one small photosensitive element $PD_4$ that is coupled to the capacitor C. The differential integration for the small photosensitive element $PD_4$ and the one large photosensitive element $PD_{1-3}$ further extends the dynamic range of the image sensor. The integration times for photosensitive element $PD_4$ and the photosensitive element $PD_{1-3}$ may be different. In one embodiment, the exposure time of the small photosensitive element $PD_4$ is the sum of the integration time for the small photosensitive element $PD_4$ and the integration time of the one large photosensitive element $PD_{1-3}$, while the exposure time of the one large photosensitive element $PD_{1-3}$ is the sum of the integration time of the one large photosensitive element $PD_{1-3}$ and the 3T readout time.

In FIG. 5, during signal integration, a bloomed charge from the small photosensitive element $PD_4$ is stored by capacitor C that is coupled to the DFD transistor and the overflow node (e.g., $FD_4$), and at the end of integration, the bloomed charge stored on the capacitor C is read out using pseudo-CDS 3T timing and the image charge from the one large photosensitive element $PD_{1-3}$ is reading out using Dual Conversion Gain (DCG). In this embodiment, to perform DCG readout, first, FD is reset via RST transistor. DFD transistor is turned on to sample low conversion gain (LCG) reset. DFD transistor is then turned off to sample the high conversion gain (HCG) reset. The image charge on the photosensitive element $PD_{1-3}$ is transferred to the bitline while the DFD transistor is kept off to sample HCG signal, then DFD transistor is turned ON and later the residual charge from photosensitive element $PD_{1-3}$ is transferred while DFD transistor is kept ON, to sample LCG signal. Finally, both HCG and LCG CDS are completed without destruction of the total signal accumulated in $PD_{1-3}$.

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 7A:
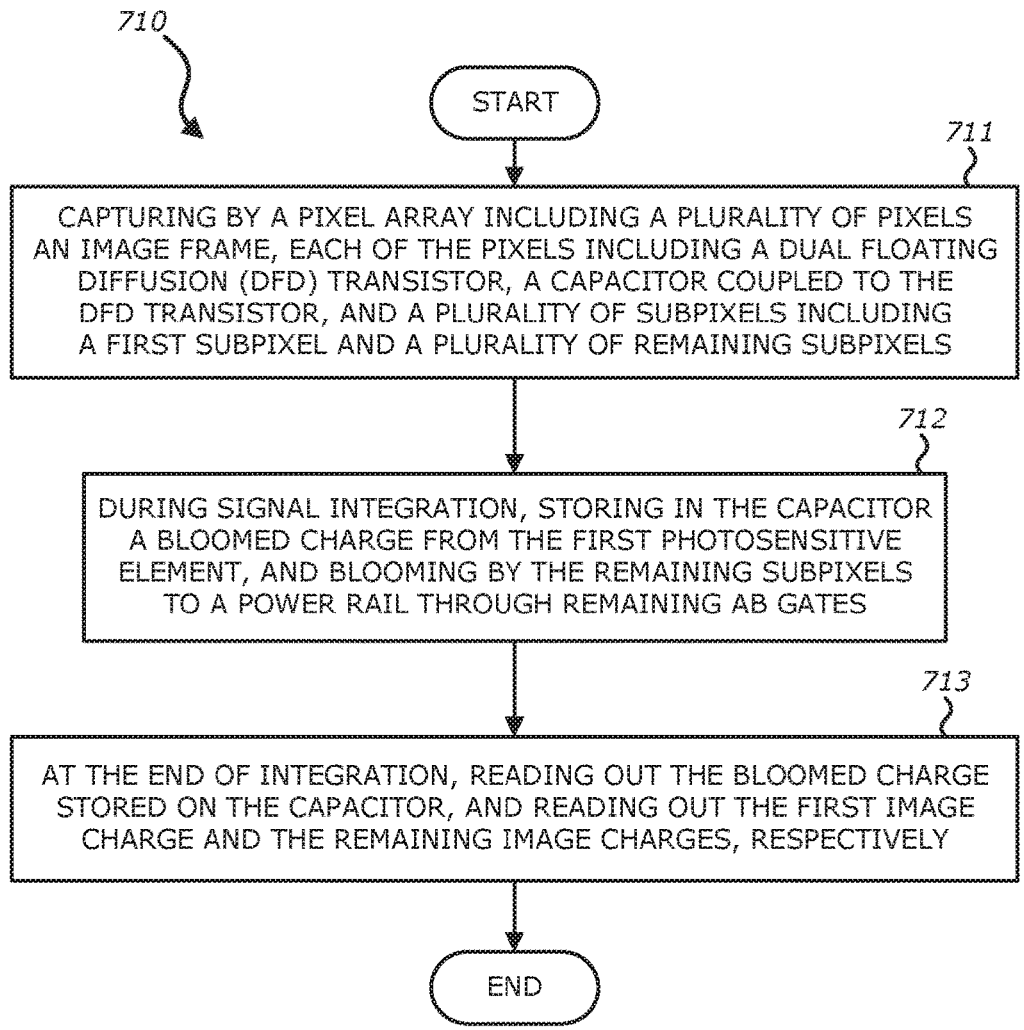
FIGS. 7A-7C are flowcharts illustrating methods of detecting a LED without flickering in accordance to one embodiment of the invention.
Figure 7B:
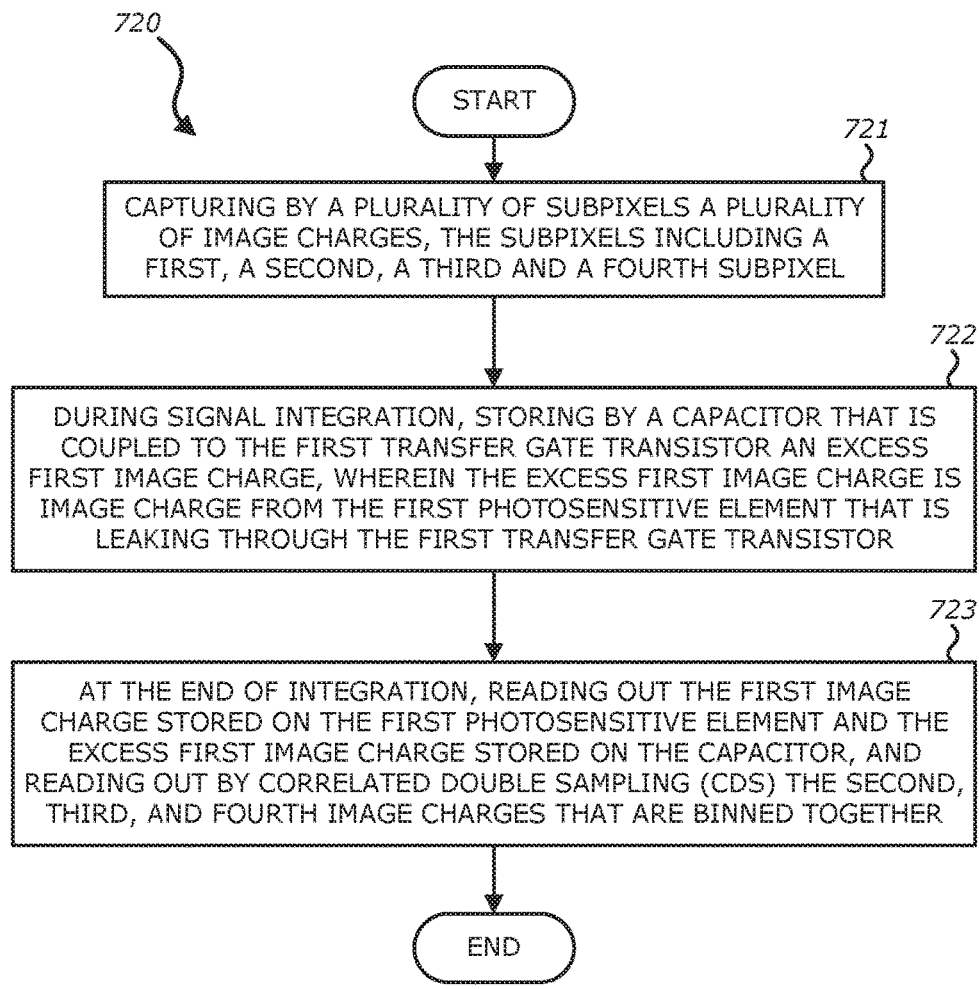
Figure 7C:
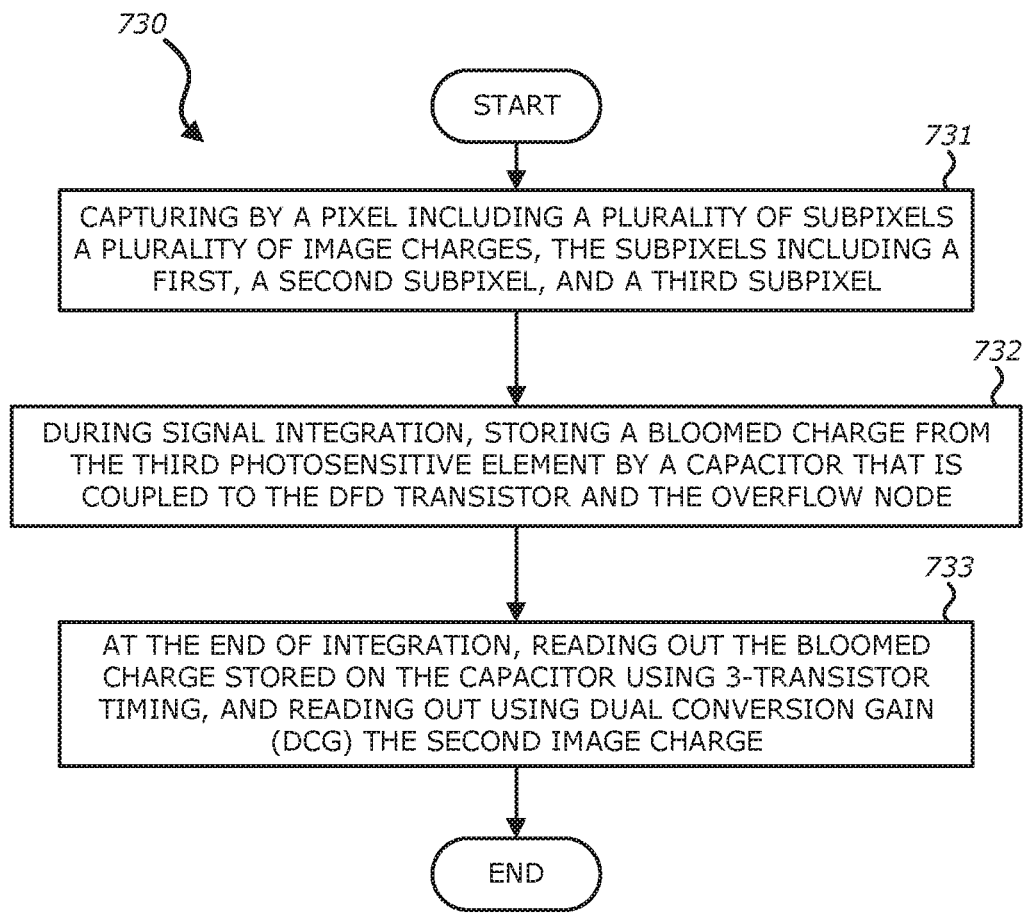

FIGS. 7A-7C are flowcharts illustrating methods of detecting a LED without flickering in accordance to one embodiment of the invention.

FIG. 7A may be a method implemented using the image sensor in the embodiment in FIG. 2. The method 710 starts with a pixel array including a plurality of pixels capturing an image frame (Block 711). Each of the pixels including a DFD transistor, a capacitor coupled to the DFD transistor, and a plurality of subpixels including a first subpixel and a plurality of remaining subpixels. The first subpixel may include a first photosensitive element to acquire a first image charge, a first transfer gate transistor to selectively transfer the first image charge from the first photosensitive element to a first floating diffusion (FD) node, and a first anti-blooming (AB) gate coupled to the first photosensitive element. The first AB gate may be biased to leak less than the first transfer gate transistor. The remaining subpixels may include remaining photosensitive elements to acquire remaining image charges, a remaining transfer gate transistors to selectively transfer the remaining image charge from the remaining photosensitive element to remaining floating diffusion (FD) nodes, respectively, and remaining anti-blooming (AB) gates coupled to the remaining photosensitive elements, respectively. The remaining AB gates may be biased to leak more than the remaining transfer gate transistors. The DFD transistor may be coupled to the first FD node, the remaining FD nodes, the first AB gate, and the remaining AB gates included in each of the subpixels. In one embodiment, the pixel array is arranged in a Bayer color pattern as shown in FIG. 3, the first photosensitive element includes a color filter and the remaining photosensitive elements include a clear color filter. In this embodiment, a signal from the first subpixel is combined in image sensor processing (ISP) with signals from the remaining subpixel to produce a final image. In this embodiment, the signal from the first subpixel is an RGB color signal and the signals from the remaining subpixels are clear color signals. At Block 712, during signal integration, the capacitor stores a bloomed charge from the first photosensitive element, and the remaining subpixels bloom to a power rail through remaining AB gates. The first transfer gate transistor and the remaining transfer gate transistors may be turned on together or at separate times. At Block 713, at the end of integration, the bloomed charge stored on the capacitor is read out, and the first image charge and the remaining image charges, respectively, are read out. In some embodiments, at the end of integration, the bloomed charge stored on the capacitor is read out using three transistors (3T) timing while the first image charge and the remaining image charges, respectively, are read out using four transistors (4T) timing.

FIG. 7B may be a method implemented using the image sensor in the embodiment in FIG. 4. The method 720 starts at Block 721 with a plurality of subpixels capturing a plurality of image charges. The subpixels may include a first, a second, a third, and a fourth subpixel. The first subpixel includes a first photosensitive element to acquire a first image charge and a first transfer gate transistor to selectively transfer the first image charge from the first photosensitive element to a first floating diffusion (FD) node. The second subpixel includes a second photosensitive element to acquire a second image charge and a second transfer gate transistor to selectively transfer the second image charge from the second photosensitive element to a second FD node. The third subpixel includes a third photosensitive element to acquire a third image charge and a third transfer gate transistor to selectively transfer the third image charge from the third photosensitive element to the second FD node. The fourth subpixel includes a fourth photosensitive element to acquire a fourth image charge and a fourth transfer gate transistor to selectively transfer the fourth image charge from the fourth photosensitive element to the second FD node. A DFD transistor may be coupled to the first and the second FD nodes.

At Block 722, during signal integration, a capacitor that is coupled to the first transfer gate transistor stores an excess first image charge. The excess first image charge is image charge from the first photosensitive element that is leaking through the first transfer gate transistor.

At Block 723, at the end of integration, the first image charge stored on the first photosensitive element and the excess first image charge stored on the capacitor are read out using 3T timing, and the second, third, and fourth image charges that are binned together are reading out by Correlated Double Sampling (CDS). In one embodiment, read out by Correlated Double Sampling (CDS) may include reading out the second, third, and fourth image charges that are binned together, and reading out the second, third, and fourth image charges that are binned together and the excess first image charge. In one embodiment, if the capacitor saturates, the DFD transistor and a reset transistor coupled to a power rail and the second FD node provides an anti-blooming path for the first photosensitive element, and the second, third, and fourth transfer gate transistors and the reset transistor provide an anti-blooming path for the second, third, and fourth photosensitive elements.

FIG. 7C may be a method implemented using the image sensor in the embodiment in FIG. 5. The method 730 starts at Block 731 with a pixel including a plurality of subpixels capturing a plurality of image charges. The subpixels may include a first, a second subpixel, and a third subpixel. In one embodiment, the first subpixel includes a first photosensitive element to acquire a first image charge. The first photosensitive element is coupled to a first floating diffusion (FD) node. The second subpixel includes a second photosensitive element to acquire a second image charge, and a second transfer gate transistor to selectively transfer the second image charge from the second photosensitive element to the first FD node. The third subpixel includes a third photosensitive element to acquire a third image charge. The third photosensitive element may be coupled to an overflow node. In one embodiment, integration times for the second photosensitive element and the third photosensitive element are different. In one embodiment, a DFD transistor is coupled to the first FD node and to the overflow node. At Block 732, during signal integration, a bloomed charge from the third photosensitive element is stored by a capacitor that is coupled to the DFD transistor and the overflow node. At Block 733, at the end of integration, the bloomed charge stored on the capacitor is read out using pseudo-CDS 3T timing, and the second image charge is read out using Dual Conversion Gain (DCG).

Figure 9:
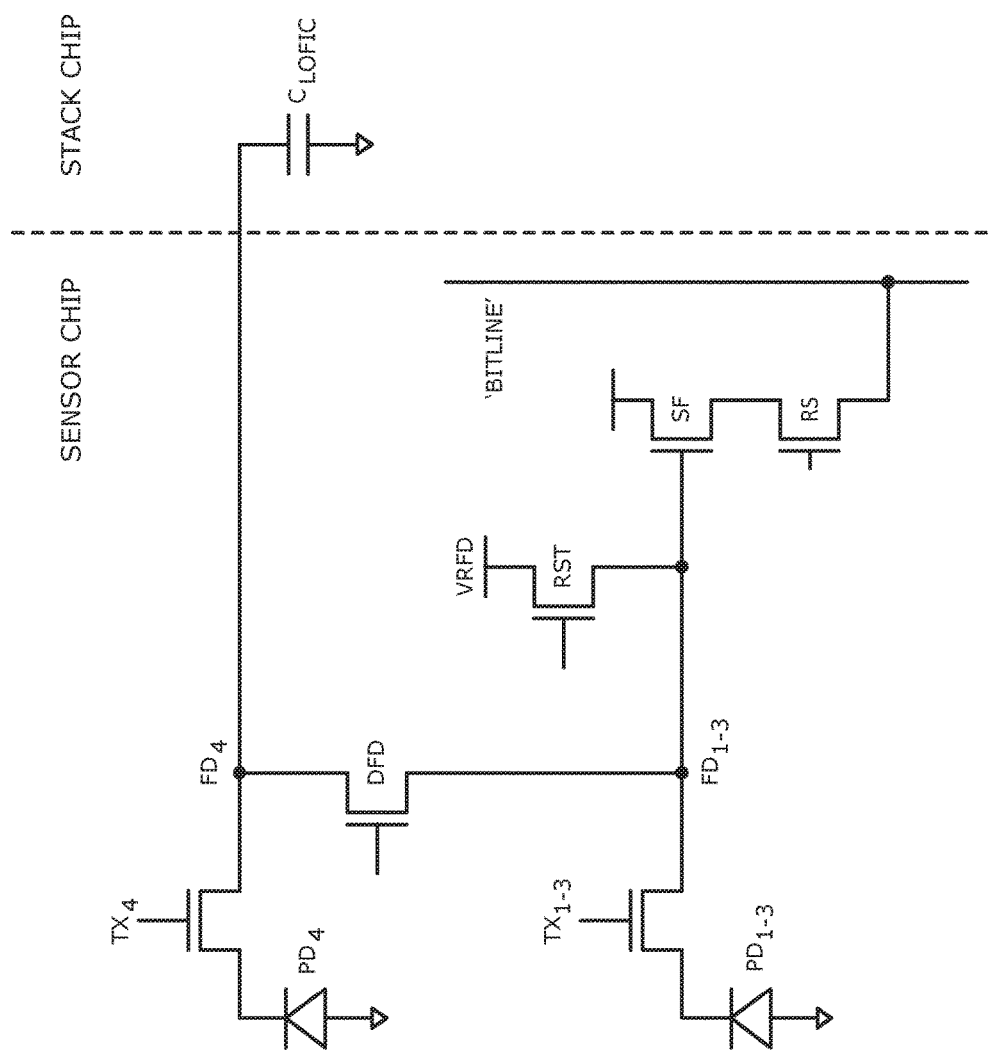
FIG. 9 is a block diagram of a pixel in the pixel array in the imaging system in FIG. 1 that detects a LED without flickering in accordance to one embodiment of the invention.

FIG. 9 is a block diagram of a pixel in the pixel array in the imaging system in FIG. 1 that detects a LED without flickering in accordance to one embodiment of the invention. To address the issues of overflow and loss of useful information from saturated pixels for HDR applications, the image sensor including the pixel array and ADC circuitry in FIG. 9 uses a hybrid stack chip that includes a sensor chip (or top wafer) and a stack chip (or carrier wafer or bottom wafer). Similar to the embodiment in FIG. 8, the pixel circuitry includes one large photosensitive element $PD_{1-3}$ and one small photosensitive element $PD_4$ that is coupled to the capacitor C. The differential integration for the small photosensitive element $PD_4$ and the one large photosensitive element $PD_{1-3}$ further extends the dynamic range of the image sensor. The integration times for photosensitive element $PD_4$ and the photosensitive element $PD_{1-3}$ may be different.

In this embodiment, the subpixels including the photosensitive elements $PD_{1-3}$ and $PD_4$ and the transfer gate transistors $TX_{1-3}$ and $TX_4$, the DFD transistor, the SF transistor and the reset transistor are disposed on a first semiconductor die (e.g., sensor chip), and the capacitor C (or $C_{LOFIC1}$) is disposed on a second semiconductor die (e.g., stack chip). The first and the second semiconductor dies are stacked and coupled to form a stacked image sensor. In one embodiment, the stack chip includes the capacitor C (or integration capacitor) for 3T readout. In some embodiments, low cost capacitors of different possible Metal Oxide Conductor Capacitor (MOSCAP) designs may be used as capacitor C. In one embodiment, the readout for the small photosensitive element $PD_4$ is a 3T rolling shutter readout. In one embodiment, the large photosensitive element $PD_{1-3}$ readout is 4T rolling-shutter readout high-CG, with anti-blooming gate, with very low Full Well and very low Dark current. The low-pass difference (LPD) anti-blooming gate may be optionally used in the pixel circuitry corresponding to the large photosensitive element $PD_{1-3}$ at high light.

Figure 10:
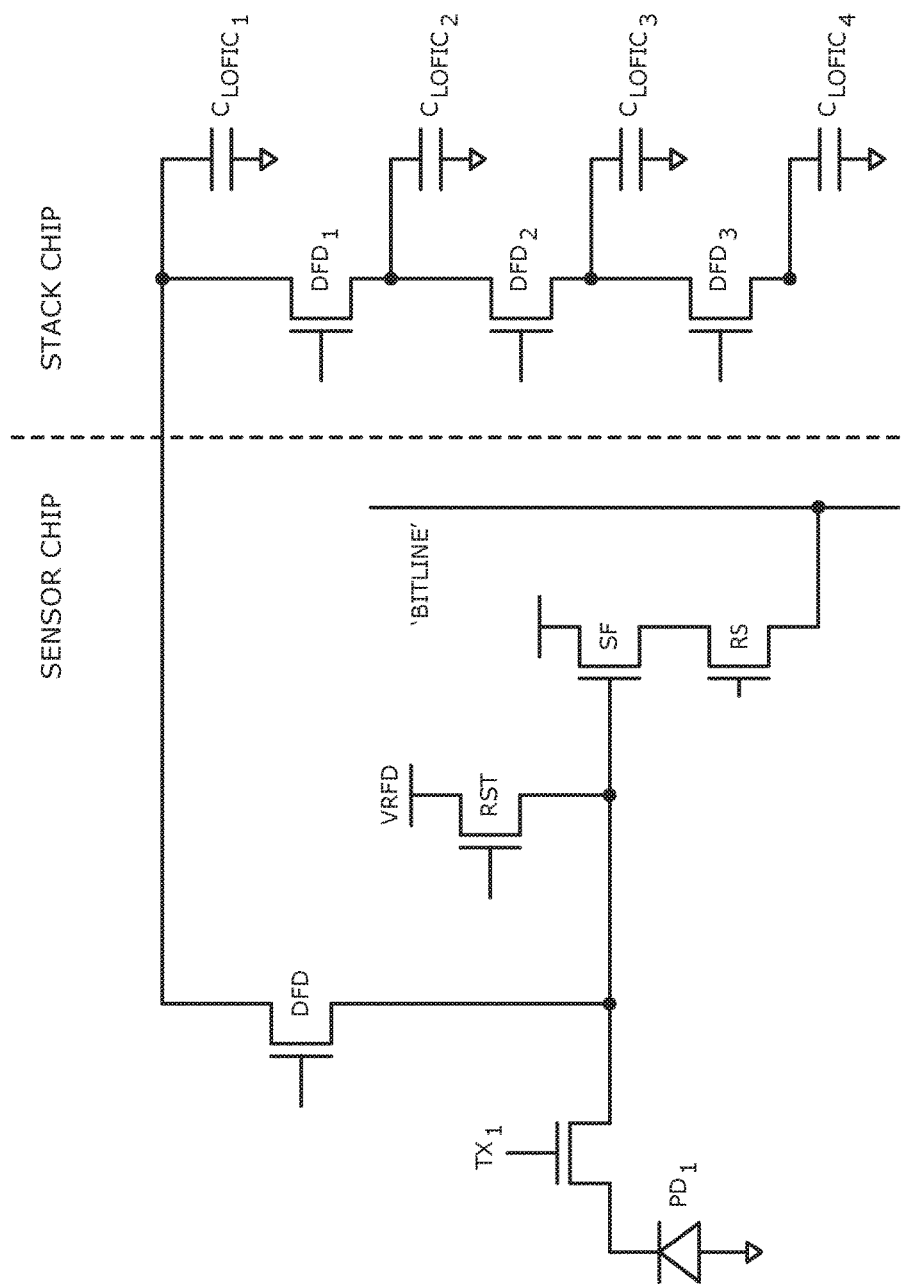
FIG. 10 is a block diagram of a pixel in the pixel array in the imaging system in FIG. 1 that detects a LED without flickering in accordance to one embodiment of the invention.

FIG. 10 is a block diagram of a pixel in the pixel array in the imaging system in FIG. 1 that detects a LED without flickering in accordance to one embodiment of the invention. Similar to the embodiment in FIG. 9, in FIG. 10, a stack chip is used. However, in lieu of a single capacitor, multiple overflow-capacitors are included on a carrier wafer of a stack chip in the embodiment of FIG. 10. While FIG. 10 includes a single subpixel including a photosensitive element $PD_1$ and transfer gate transistor $TX_1$, it is understood, that the embodiment in FIG. 10 may include a plurality of subpixels as discussed in herein. Thus, each of the pixels in the pixel array 105 may include a plurality of subpixels disposed on a first semiconductor die (e.g., sensor chip).

In FIG. 10, the first subpixel included on the sensor chip includes a first photosensitive element $PD_1$ to acquire a first image charge, and a first transfer gate transistor $TX_1$ to selectively transfer the first image charge from the first photosensitive element $PD_1$ to a first floating diffusion (FD) node that is coupled to a first dual floating diffusion (DFD) transistor. The first DFD transistor is disposed on the first semiconductor die (e.g., sensor chip). A first capacitor $C_{LOFIC1}$ is coupled to the first DFD transistor DFD and a second DFD transistor $DFD_1$, and a second capacitor $C_{LOFIC2}$ is coupled to the second DFD transistor $DFD_1$. The first capacitor $C_{LOFIC1}$, the second capacitor $C_{LOFIC2}$ and the second DFD transistor $DFD_1$ are disposed on a second semiconductor die (e.g., stack chip). The first and the second semiconductor dies are stacked and coupled to form a stacked image sensor. Further, as shown in FIG. 10, a plurality of DFD transistors and capacitors $C_{LOFIC}$ may be coupled and included in the stack chip. The readout sequence of the embodiment in FIG. 10 may include reading out in 4T readout at the first FD node for the darkest signal level, reading out the first capacitor $C_{LOFIC1}$ for higher signal level than that of the first FD node (e.g., overflow from the photosensitive element $PD_1$), and reading out the second capacitor $C_{LOFIC2}$ for higher signal level than that of the first capacitor $C_{LOFIC1}$, etc.

Figure 11:
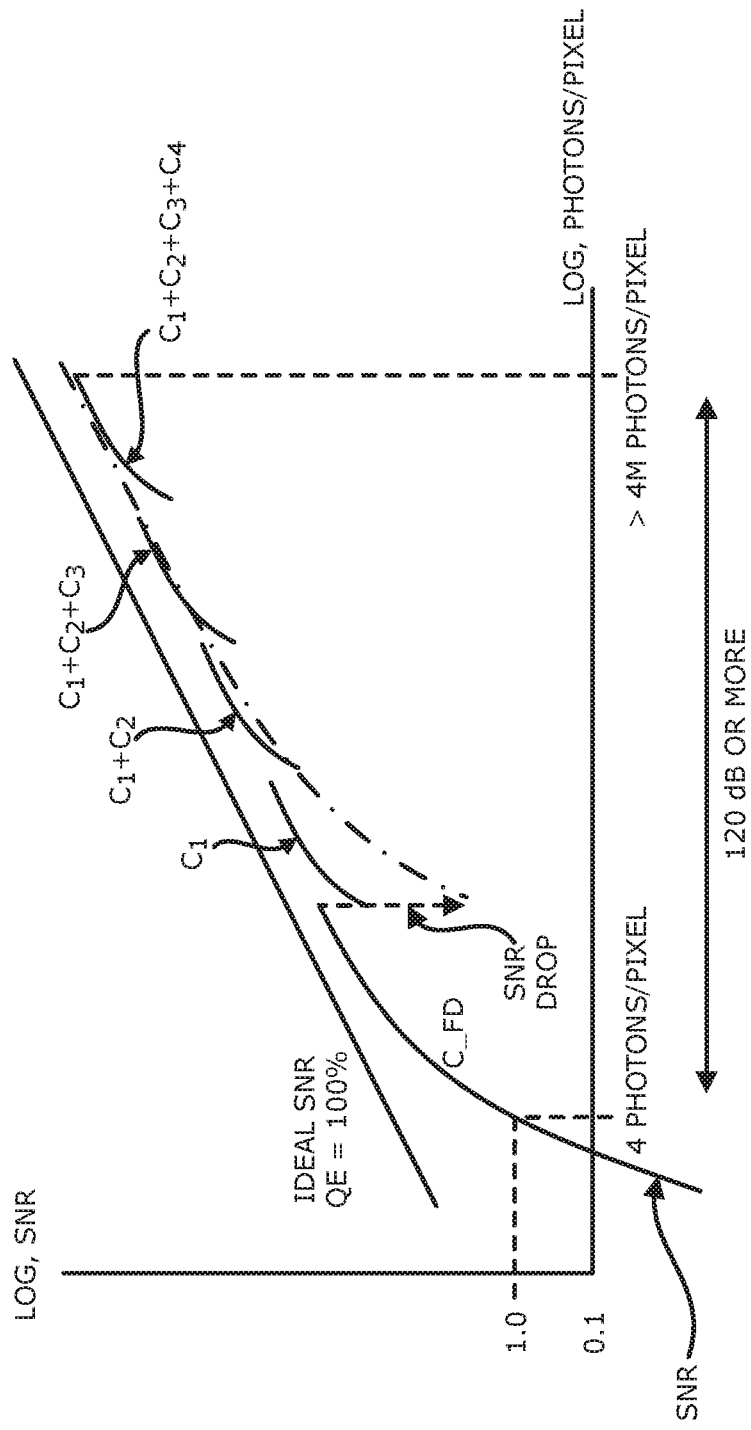
FIG. 11 is a graph illustrating the relation between the signal-to-noise ratio (SNR) and the dynamic range (in dB) and the effects of the increased number of capacitors in the pixel in FIG. 10 on the signal-to-noise ratio (SNR) in accordance to one embodiment of the invention.

By using a plurality of capacitors on a carrier chip, the linear dynamic range of the image sensor is increased and improves HDR. Referring to FIG. 11, a graph that illustrates the relation between the signal-to-noise ratio (SNR) and the dynamic range (in dB) and the effects of the increased number of capacitors in the pixel in FIG. 10 on the signal-to-noise ratio (SNR) in accordance to one embodiment of the invention is shown. From FIG. 11, when the single capacitor is used the SNR drop is large. By using the multiple capacitors on the carrier chip of a stacked chip, the SNR drop is less and distributed.

Figure 12:
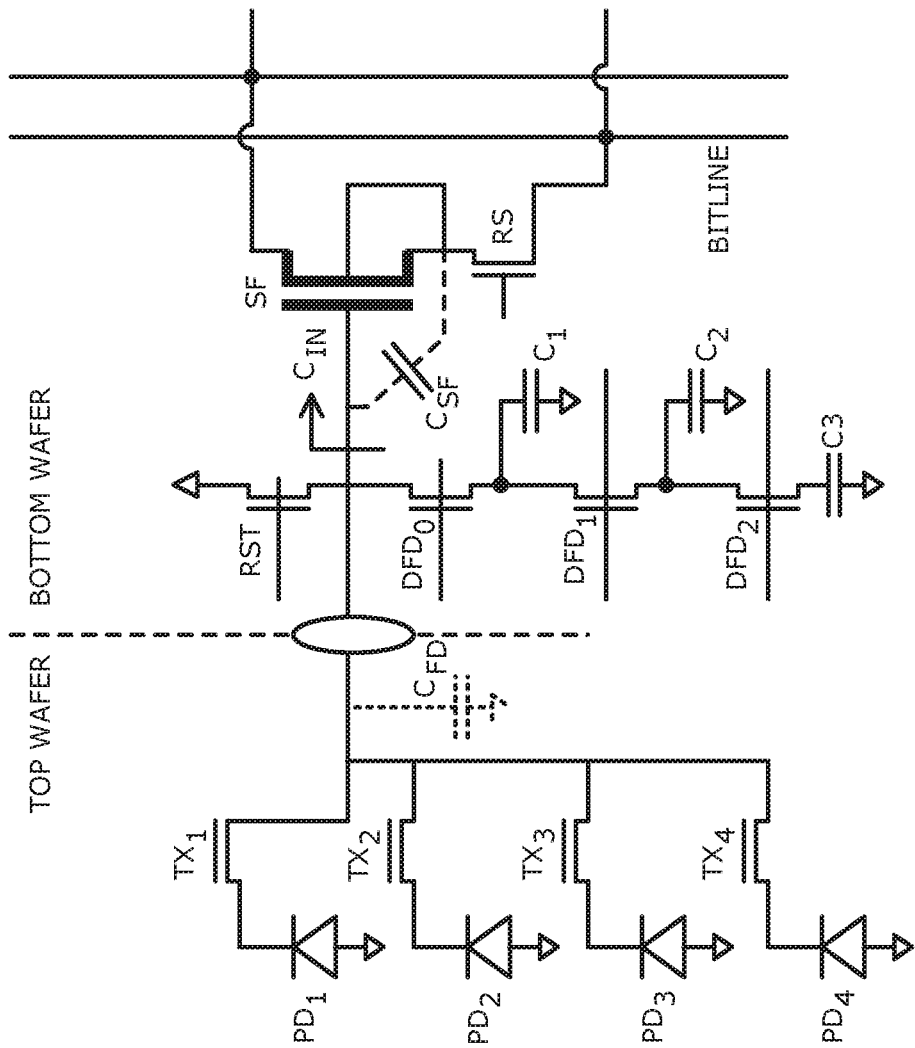
FIG. 12 is a block diagram of a pixel in the pixel array in the imaging system in FIG. 1 that detects a LED without flickering in accordance to one embodiment of the invention.
Figure 13:
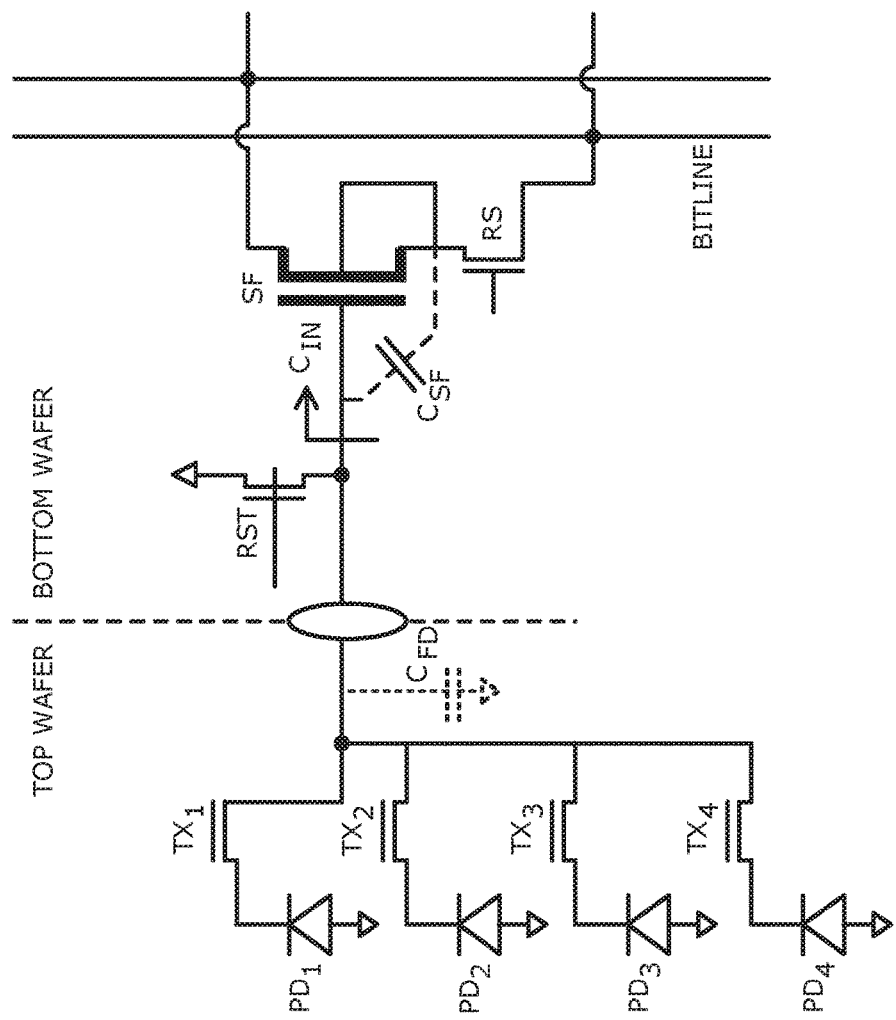
FIG. 13 is a block diagram of a pixel in the pixel array in the imaging system in FIG. 1 that detects a LED without flickering in accordance to one embodiment of the invention.

FIGS. 12-13 are block diagrams of a pixel in the pixel array in the imaging system in FIG. 1 that detects a LED without flickering in accordance to two embodiments of the invention. In the embodiments in FIGS. 12-13, the image sensor is implemented as a stacked chip. Specifically, the image sensor includes an active source-follower stack-pixels with hybrid bond for low-noise.

Referring to FIGS. 12-13, a plurality of subpixels disposed on a first semiconductor die (e.g., top wafer or sensor chip). While the subpixels illustrated in FIGS. 12-13 are the subpixels included in a single pixel, it is understood that the top wafer may include subpixels from a plurality of pixels included in the pixel array 105.

As shown in FIGS. 12-13, each of the subpixels includes a photosensitive element $PD_1$-$PD_4$ to respectively acquire an image charge, and a transfer gate transistor $TX_1$-$TX_4$ to selectively transfer the respective image charge from the photosensitive element $PD_1$-$PD_4$ to a floating diffusion (FD) node. In FIGS. 12-13, the FD node is a shared floating diffusion node or region. The FD node is coupled to a larger size source follower (SF) transistor disposed on a second semiconductor die (e.g., bottom wafer) via a hybrid bond. $C_{FD}$ (e.g., 1 fF) is parasitic capacitance at the bond pad. A reset transistor RST that is disposed on the second semiconductor die is further coupled to a power rail and the first FD node. In some embodiments, the second semiconductor die (or bottom wafer) includes low CG capacitors. In one embodiment, the SF transistor and the row select transistor RS are included in the pixel circuitry whereas a column circuitry included in the readout circuitry 120 includes the other half of the differential amplifier as illustrated in FIGS. 12-13. The active SF transistor can be implemented larger size and provides more unity gain (Av) and lower input capacitance ($C_{IN}$) (e.g., $C_{IN}$ =(1-Av) $C_{SF}$ ). As shown in FIGS. 12-13, a connection line couples the body of the SF transistor to the source of row select transistor RS. This connection line may ground the substrate of the SF transistor to reduce the body effect. Accordingly, the embodiments in FIGS. 12-13 maintain high CG with a small floating diffusion FD capacitor ($C_{FD}$).

The first and the second semiconductor dies are stacked and coupled to form a stacked image sensor. In one embodiment, the SF transistor is a large size. For instance, for 1.4 µm×4 share and a 2.8 µm pitch, the width and length of the SF transistor may be between 0.5 µm×0.5 µm to 2.4 µm×2.4 µm. For 1.1 µm×4 share and 2.2 µm pitch, the width and length of the SF transistor may be between 0.3 µm×0.3 µm to 1.8 µm×1.8 µm.

In the embodiment in FIG. 12, a plurality of capacitors C1-C3 and a plurality of DFD transistors may also be disposed on the second semiconductor die. As shown in FIG. 12, a first dual floating diffusion (DFD) transistor $DFD_0$ is coupled to the FD node, a second DFD transistor $DFD_1$ is coupled to the first DFD transistor $DFD_0$, and a third DFD transistor $DFD_2$ is coupled to the second DFD transistor $DFD_1$. The first capacitor $C_1$ is coupled to the first DFD transistor $DFD_0$ and the second DFD transistor $DFD_1$, the second capacitor $C_2$ is coupled to the second DFD transistor $DFD_1$ and the third DFD transistor $DFD_2$, and the third capacitor $C_3$ is coupled to the third DFD transistor $DFD_2$. In some embodiments, the first capacitor C1, second capacitor C2, and third capacitor C3 may be 8 fF, 16 fF, 32 fF, respectively.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor to detect a high illumination element without flickering, comprising:
   a pixel array including a plurality of pixels, each of the pixels including:
   (i) a plurality of subpixels including a first, a second, and third, and a fourth subpixel,
      the first subpixel including a first photosensitive element to acquire a first image charge, a first transfer gate transistor to selectively transfer the first image charge from the first photosensitive element to a first floating diffusion (FD) node, and a first anti-blooming (AB) gate coupled to the first photosensitive element,
      the second subpixel including a second photosensitive element to acquire a second image charge, a second transfer gate transistor to selectively transfer the second image charge from the second photosensitive element to a second FD node, and a second AB gate coupled to the second photosensitive element,
      the third subpixel including a third photosensitive element to acquire a third image charge, a third transfer gate transistor to selectively transfer the third image charge from the third photosensitive element to a third FD node, and a third AB gate coupled to the third photosensitive element, and
      the fourth subpixel including a fourth photosensitive element to acquire a fourth image charge, a fourth transfer gate transistor to selectively transfer the fourth image charge from the fourth photosensitive element to a fourth FD node, and a fourth AB gate coupled to the fourth photosensitive element,
   (ii) a dual floating diffusion (DFD) transistor coupled to the first, the second, the third, and the fourth FD nodes, wherein the DFD transistor is selectively coupled to the first, the second, the third, and the fourth AB gates via the first, the second, the third, and the fourth transfer gate transistors, and
   (iii) a capacitor coupled to the DFD transistor,
   wherein the first AB gate is biased to leak less than the first transfer gate transistor, wherein the second, third, and fourth AB gates are biased to leak more than the second, third, and fourth transfer gate transistors, and
   wherein during signal integration, the DFD transistor selectively couples to the first AB gate via the first transfer gate transistor and the capacitor stores a bloomed charge from the first photosensitive element.

2. The image sensor in claim 1, wherein, at the end of integration, the bloomed charge stored on the capacitor is read out, and the first, second, third, and fourth image charges are subsequently readout as photosensitive element signals, respectively.

3. The image sensor in claim 1, wherein the first photosensitive element includes one color filter from a Bayer color pattern and the second, third and fourth photosensitive elements includes a clear color filter.

4. The image sensor in claim 3, wherein signals from first, the second, the third, and the fourth photosensitive elements are combined in image signal processing (ISP) to produce a final image charge.

5. An image sensor to detect a high illumination element without flickering, comprising:
   a pixel array including a plurality of pixels, each of the pixels including:
   (i) a plurality of subpixels including a first and a second subpixel,
      the first subpixel including a first photosensitive element to acquire a first image charge, and a first transfer gate transistor to selectively transfer the first image charge from the first photosensitive element to a first floating diffusion (FD) node, and
      the second subpixel including a second photosensitive element to acquire a second image charge, and a second transfer gate transistor to selectively transfer the second image charge from the second photosensitive element to a second FD node,
   (ii) a dual floating diffusion (DFD) transistor coupled to the first and the second FD nodes, and
   (iii) a capacitor coupled to the DFD transistor;
   a source follower (SF) transistor coupled to the second FD node and the DFD transistor to output a charge from at least one of the first or the second FD nodes; and
   a reset transistor coupled to a power rail and the second FD node,
   wherein the first photosensitive element performs detection of the high illumination element, wherein the capacitor is coupled to the first transfer gate transistor to store excess first image charge, wherein the excess first image charge is image charge from the first photosensitive element that is leaking through the first transfer gate transistor,
   wherein the second photosensitive element is larger than the first photosensitive element,
   wherein the subpixels, the DFD transistor, the SF transistor and the reset transistor are disposed on a first semiconductor die, and the capacitor is disposed on a second semiconductor die, wherein the first and the second semiconductor dies are stacked to form a stacked image sensor.

6. The image sensor in claim 5, wherein the plurality of subpixels further include a third and a fourth subpixel,
   the third subpixel including a third photosensitive element to acquire a third image charge, and a third transfer gate transistor to selectively transfer the third image charge from the third photosensitive element to the second FD node, and the fourth subpixel including a fourth photosensitive element to acquire a fourth image charge, and a fourth transfer gate transistor to selectively transfer the fourth image charge from the fourth photosensitive element to the second FD node.

7. The image sensor in claim 6, wherein the first image charge stored on the first photosensitive element and the excess first image charge stored on the capacitor are read out, and the second, third, and fourth image charges are binned together and subsequently readout by Correlated Double Sampling (CDS).

8. The image sensor in claim 7, wherein the image charges are readout three times, wherein
   (i) the first image charge and the excess first image charge are readout,
   (ii) the second, third, and fourth image charges that are binned together are then readout, and
   (iii) the second, third, and fourth image charges that are binned together and the excess first image charge are then readout.

9. An image sensor to detect a high illumination element without flickering comprising:
   a pixel array including a plurality of pixels, each of the pixels including:
      a plurality of subpixels disposed on a first semiconductor die including a first subpixel, the first subpixel including a first photosensitive element to acquire a first image charge, and a first transfer gate transistor to selectively transfer the first image charge from the first photosensitive element to a first floating diffusion (FD) node,
      a first dual floating diffusion (DFD) transistor coupled to the FD node, wherein the first DFD transistor is disposed on the first semiconductor die,
      a first capacitor coupled to the first DFD transistor and a second DFD transistor, and
      a second capacitor coupled to the second DFD transistor,
      wherein the first capacitor, the second capacitor and the second DFD transistor are disposed on a second semiconductor die, wherein the first and the second semiconductor dies are stacked to form a stacked image sensor.

10. The image sensor of claim 9, further comprising:
   a source follower (SF) transistor coupled to the first FD node and the DFD transistor to output a charge from the first FD node; and
   a reset transistor coupled to a power rail and the first FD node.

11. A method to detect a high illumination element without flickering comprising:
   capturing by a pixel array including a plurality of pixels an image frame, each of the pixels including a dual floating diffusion (DFD) transistor, a capacitor coupled to the DFD transistor, and a plurality of subpixels including a first subpixel and a plurality of remaining subpixels,
      wherein the first subpixel includes a first photosensitive element to acquire a first image charge, a first transfer gate transistor to selectively transfer the first image charge from the first photosensitive element to a first floating diffusion (FD) node, and a first anti-blooming (AB) gate coupled to the first photosensitive element, wherein the first AB gate is biased to leak less than the first transfer gate transistor,
      wherein the remaining subpixels includes remaining photosensitive elements to acquire remaining image charges, a remaining transfer gate transistors to selectively transfer the remaining image charge from the remaining photosensitive element to remaining floating diffusion (FD) nodes, respectively, and remaining anti-blooming (AB) gates coupled to the remaining photosensitive elements, respectively, wherein the remaining AB gates are biased to leak more than the remaining transfer gate transistors,
      the dual floating diffusion (DFD) transistor is coupled to the first FD node, the remaining FD nodes, the first AB gate, and the remaining AB gates included in each of the subpixels;
   during signal integration, storing in the capacitor a bloomed charge from the first photosensitive element, and blooming by the remaining subpixels to a power rail through remaining AB gates; and
   at the end of integration, reading out the bloomed charge stored on the capacitor, and reading out the first image charge and the remaining image charges, respectively.

12. The method of claim 11, further comprising: turning on the first transfer gate transistor and the remaining transfer gate transistors together or at separate times.

13. The method of claim 11, wherein the pixel array is arranged in a Bayer color pattern, the first photosensitive element includes a color filter and the remaining photosensitive elements include a clear color filter.

14. The method of claim 13, further comprising: combining in image sensor processing (ISP) a signal from the first subpixel with signals from the remaining subpixel to produce a final image, wherein the signal from the first subpixel is an RGB color signal and the signals from the remaining subpixels are clear color signals.

15. A method to detect a high illumination element without flickering comprising:
   capturing by a plurality of subpixels a plurality of image charges, the subpixels including a first, a second, a third and a fourth subpixel, wherein
      the first subpixel includes a first photosensitive element to acquire a first image charge and a first transfer gate transistor to selectively transfer the first image charge from the first photosensitive element to a first floating diffusion (FD) node,
      the second subpixel includes a second photosensitive element to acquire a second image charge and a second transfer gate transistor to selectively transfer the second image charge from the second photosensitive element to a second FD node,
      the third subpixel includes a third photosensitive element to acquire a third image charge and a third transfer gate transistor to selectively transfer the third image charge from the third photosensitive element to the second FD node,
      the fourth subpixel includes a fourth photosensitive element to acquire a fourth image charge and a fourth transfer gate transistor to selectively transfer the fourth image charge from the fourth photosensitive element to the second FD node,
      wherein a dual floating diffusion (DFD) transistor is coupled to the first and the second FD nodes;
   during signal integration, storing by a capacitor that is coupled to the first transfer gate transistor an excess first image charge, wherein the excess first image charge is image charge from the first photosensitive element that is leaking through the first transfer gate transistor;

at the end of integration,
reading out the first image charge stored on the first photosensitive element and the excess first image charge stored on the capacitor, and
reading out by Correlated Double Sampling (CDS) the second, third, and fourth image charges that are binned together.

16. The method of claim 15, wherein readout by Correlated Double Sampling (CDS) the second, third, and fourth image charges that are binned together further comprises:
reading out the second, third, and fourth image charges that are binned together, and
reading out the second, third, and fourth image charges that are binned together and the excess first image charge.

17. The method of claim 15, wherein if the capacitor saturates, the DFD transistor and a reset transistor coupled to a power rail and the second FD node provides an anti-blooming path for the first photosensitive element, and wherein the second, third, and fourth transfer gate transistors and the reset transistor provide an anti-blooming path for the second, third, and fourth photosensitive elements.

* * * * *